United States Patent [19]

Baur et al.

[11] Patent Number: 4,698,559

[45] Date of Patent: Oct. 6, 1987

[54] POWER AMPLIFIERS FOR DRIVING INDUCTIVE LOADS

[75] Inventors: Bruce K. Baur, Milwaukie; Gordon W. Meigs, Beaverton, both of Oreg.

[73] Assignee: Tektronix, Inc., Beaverton, Oreg.

[21] Appl. No.: 871,983

[22] Filed: Jun. 9, 1986

Related U.S. Application Data

[63] Continuation-in-part of Ser. No. 651,732, Sep. 17, 1984.

[51] Int. Cl.[4] ............................ G01S 1/16; G01S 1/18
[52] U.S. Cl. .................................................... 315/408
[58] Field of Search .............................. 315/408, 399

[56] References Cited

U.S. PATENT DOCUMENTS

| | | | |
|---|---|---|---|
| 4,223,367 | 9/1980 | Zappala | 315/408 |
| 4,247,805 | 1/1981 | Zappala | 315/408 |
| 4,400,653 | 8/1983 | Olmstead | 315/408 |

Primary Examiner—Theodore M. Blum
Attorney, Agent, or Firm—John D. Winkelman; John Smith-Hill

[57] ABSTRACT

A power amplifier circuit for driving an inductive load comprises a capacitor coupled between first and second circuit nodes, a first unidirectionally-conductive device having a first terminal coupled to the first circuit node, and a transistor having its collector coupled to the second terminal of the first unidirectionally-conductive device and having its emitter coupled to the second circuit node. The direction of conduction of the first unidirectionally-conductive device is the same as the direction of conduction through the collector-emitter path of the transistor. The circuit also comprises a second unidirectionally-conductive device connected in parallel with the first unidirectionally-conductive device for conducting current in the opposite direction from the direction of conduction of the first unidirectionally-conductive device.

9 Claims, 4 Drawing Figures

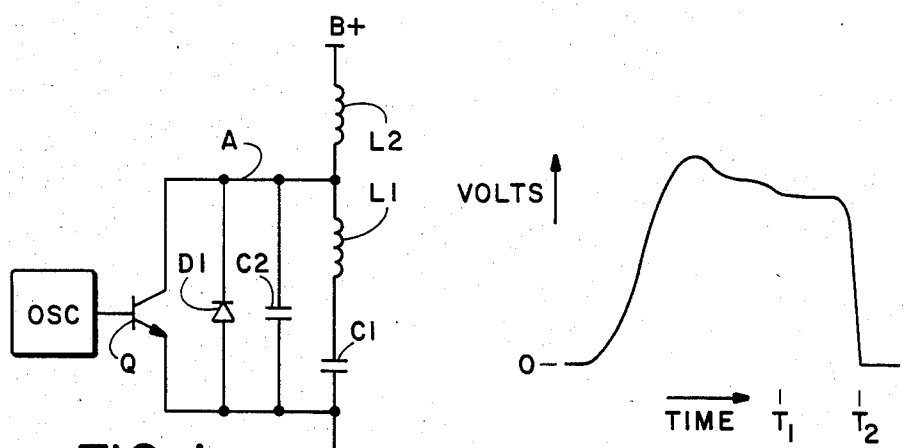
FIG. 1 PRIOR ART
FIG. 2
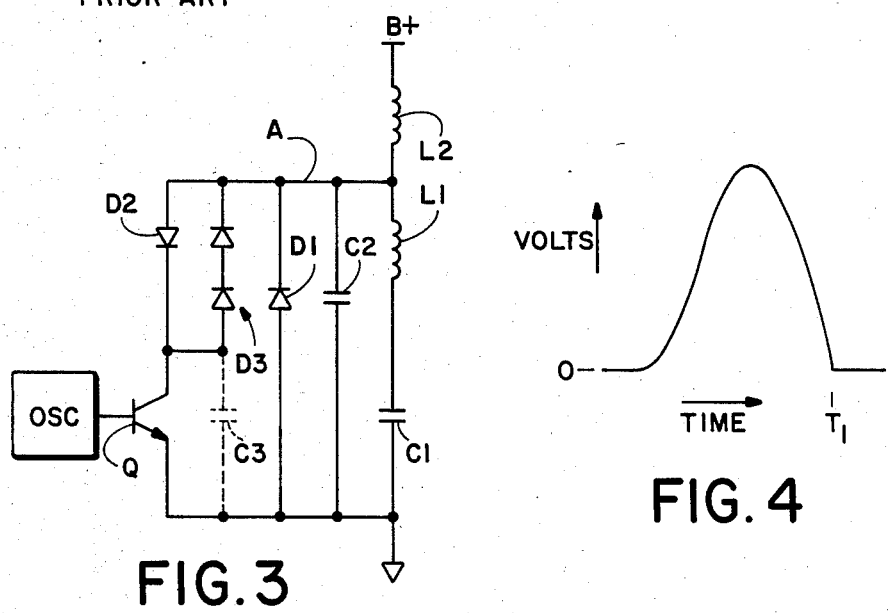
FIG. 3
FIG. 4

POWER AMPLIFIERS FOR DRIVING INDUCTIVE LOADS

CROSS-REFERENCE TO RELATED APPLICATION

This is a continuation-in-part of co-pending application Ser. No. 651,732 filed Sept. 17, 1984.

BACKGROUND OF THE INVENTION

This invention relates to power amplifiers and, in particular, to power amplifier that are capable of delivering large amounts of current to inductive loads at relatively high repetition rates.

A power amplifier that is designed to drive an inductive load typically operates as a high-current switching device. One such power amplifier of this type is known as a resonant scan deflection circuit and is used to drive the horizontal deflection yoke of a cathode-ray tube.

A conventional resonant scan deflection circuit is shown in FIG. 1. The operation of this circuit may be described in the following three cycles:

A. The transistor Q is turned on. The transistor receives collector current from the deflection yoke L1 (due to charge previously stored in the S-capacitor C1) and from the decoupling inductor L2. The collector current ramps up from zero towards some maximum value. The voltage at the node A is close to ground.

B. The transistor Q is turned off and a resonant circuit consisting primarily of the deflection yoke L1 and the flyback capacitor C2 is formed. The voltage at the node A follows the first half of a cycle of a sine wave. At the beginning of the second half of the cycle of the sine wave, when the voltage at the node A goes negative, the damper diode D1 becomes conductive and damps the operation of the resonant circuit.

C. The voltage at the node A is negative. Current flows through the damper diode D1 to the deflection yoke L1 and the decoupling inductor L2. The current in the yoke L1 ramps up from a negative value to zero. Base current is supplied to the transistor Q well before the end of cycle C in order to ensure that the transistor is conductive before the end of cycle C.

In accordance with the disclosure of copending application Ser. No. 651,732 filed Sept. 17, 1984, an isolation diode may be connected between the collector of the transistor Q and the node A in order to prevent the collectorbase junction of the transistor from turning on during cycle C due to the negative voltage at the node A, and thereby robbing the transistor of the base current at the end of cycle C.

SUMMARY OF THE INVENTION

It was found that the circuit of FIG. 1, modified to include an isolation diode in accordance with the teaching of the aforesaid copending application, dissipated more power than expected. In particular, it was found that in an implementation of the modified FIG. 1 circuit, operating at 125 kHz, the voltage at the collector of the transistor Q followed the waveform shown in FIG. 2 during cycle B and did not drop to zero until time $t_2$, about 750 ns after the time $t_1$ at which it was expected to drop to zero. Power was consumed at the rate of 60.7 watts, whereas it was expected that the power consumption should not be more than about 46 watts.

On close examination of the modified FIG. 1 circuit, it was realized that the isolation diode was disconnecting the stray capacitance between the collector of the transistor Q and ground from the flyback capacitor C2. Thus, when the flyback capacitor C2 discharges, the stray capacitance and the S-capacitor C1 are both charged, but the isolation diode prevents the charge stored in the stray capacitance from discharging back into the flyback capacitor C2. When the transistor Q is next turned on, the stray capacitance is discharged through the collector-emitter path of the transistor and the stored energy is dissipated in the transistor as heat.

The measured value of the stray capacitance was 286 pF and the maximum voltage at the node A was 900 v. It can be shown that the additional power dissipation at an operating frequency of 125 kHz is equal to 14.5 watts.

A preferred embodiment of the present invention is a power amplifier circuit for driving an inductive load that is coupled between first and second circuit nodes. The power amplifier circuit comprises a capacitor coupled between the first and second circuit nodes, a first unidirectionally-conductive device having first and second terminals, the first terminal being coupled to the first circuit node, and a transistor having its collector coupled to the second terminal of the first unidirectionally-conductive device and having its emitter coupled to the second circuit node. The direction of conduction of the first unidirectionally-conductive device is the same as the direction of conduction through the collector-emitter path of the transistor. A second unidirectionally-conductive device is connected in parallel with the first unidirectionally-conductive device for conducting current in the opposite direction from the direction of conduction of the first unidirectionally-conductive device.

BRIEF DESCRIPTION OF THE DRAWINGS

For a better understanding of the invention, and to show how the same may be carried into effect, reference will now be made, by way of example, to the accompanying drawings in which:

FIG. 1 is a schematic diagram of a conventional resonant scan deflection circuit, FIG. 2 shows the waveform of the voltage at the collector of the transistor Q in a modification of the FIG. 1 circuit, FIG. 3 is a schematic diagram of a resonant scan deflection circuit embodying the present invention, and FIG. 4 shows the waveform of the voltage at the collector of the transistor Q of FIG. 2 (a).

In FIGS. 1 and 3, like reference characters represent corresponding elements.

DETAILED DESCRIPTION

FIG. 3 illustrates the isolation diode D2 connected between the node A and the collector of the transistor Q, in accordance with the teaching of the co-pending application. The FIG. 3 circuit also comprises a diode string D3 connected in parallel with the diode D2. The stray capacitance C3 between the collector of the transistor Q and ground is then effectively in parallel with the capacitor C2, with three diodes of hysteresis. That is, the potential at the collector of the transistor Q follows the potential at the node A except that if the potential at the node A falls, the collector potential remains two diode drops above the potential at the node A, and if the potential at the node A rises, the collector potential remains one diode drop below the potential at the node A. Therefore, when the node A goes negative, most of the energy stored in the stray capacitance C3 and in the capacitor C1 is discharged into the deflection yoke L1 and very little energy is retained for discharge through the collector-emitter path of the transistor when then the transistor next turns on.

The string D3 of diodes is used instead of a single diode in parallel with the diode D2 in order to compensate for the relatively large voltage drop that occurs across the damper diode D1 during cycle C, when the node A is negative, and thereby ensure that the collector of the transistor Q is always positive and that no current will flow from the collector of the transistor Q to the node A.

FIG. 4 shows the waveform at the collector of the transistor Q of an implementation of the FIG. 3 circuit, driven at 125 kHz. In that implementation, which is the same as the implementation of the modified FIG. 1 circuit except for the addition of the diode string D3, power is consumed at the rate of 46.8 watts, for a saving of almost 25% as compared with the modified FIG. 1 circuit.

It will be appreciated that the present invention is not restricted to the particular circuit that has been described and illustrated, and that variations may be made therein without departing from the scope of the invention as defined in the appended claims. For example, if, as in the aforesaid co-pending application, a bridge rectifier were used in lieu of the single damper diode D1, it would be necessary to use more than two diodes, e.g. four diodes, in the diode string D3 in order to compensate for the higher voltage drop across the bridge rectifier.

We claim:

1. A power amplifier circuit for driving an inductive load coupled between first and second nodes of the amplifier circuit, comprising:
   capacitor means coupled between said first and second circuit nodes,
   first unidirectionally-conductive means having first and second terminals, the first terminal being coupled to the first circuit node,
   a transistor having its collector coupled to the second terminal of the first unidirectionally-conductive means and having its emitter coupled to the second circuit node, the direction of conduction of the first unidirectionally-conductive means being the same as the direction of conduction through the collector-emitter path of the transistor,
   second unidirectionally-conductive means connected in parallel with the first unidirectionally-conductive means for conducting current in the opposite direction from the direction of conduction of the first unidirectionally-conductive means, the second unidirectionally-conductive means having first and second terminals which are in d.c. coupled relationship with the first and second terminals respectively of the first unidirectionally-conductive means, and
   third unidirectionally-conductive means coupled between the first and second circuit nodes, the direction of conduction of the third unidirectionally-conductive means being opposite from that of the first unidirectionallyconductive means and the collector-emitter path of the transistor.

2. A power amplifier circuit according to claim 1, wherein the third unidirectionally-conductive means comprise a diode and the second unidirectionally-conductive means comprise at least two diodes connected in series.

3. A resonant scan deflection circuit comprising:
   a deflection yoke and an S-capacitor connected in series between first and second circuit nodes,
   a flyback capacitor connected between said first and second circuit nodes,
   an isolation rectifier having first and second terminals, the first terminal being connected to the first circuit node,
   a transistor having its collector connected to the second terminal of the isolation rectifier and having its emitter connected to the second circuit node, the direction of conduction of the isolation rectifier being the same as the direction of conduction through the collector-emitter path of the transistor,
   a damper rectifier connected between the first and second circuit nodes, the direction of conduction of the damper rectifier being opposite from that of the isolation rectifier and the collector-emitter path of the transistor, and
   unidirectionally-conductive means connected in parallel with the isolation rectifier for conducting current in the opposite direction from the direction of conduction of the isolation rectifier, the unidirectionally conductive means having first and second terminals which are in d.c. coupled relationship with the first and second terminals respectively of the isolation rectifier.

4. A deflection circuit according to claim 3, wherein the damper rectifier comprises a single diode and the unidirectionally-conductive means comprise at least two diodes connected in series.

5. A deflection circuit according to claim 3, comprising a decoupling inductor having a first terminal connected to the first circuit node and also having a second terminal, for connection to a d.c. voltage source.

6. A power amplifier circuit for driving an inductive load coupled between first and second nodes of the amplifier circuit, comprising
   capacitor means coupled between said first and second circuit nodes,
   a transistor having its emitter coupled to the second circuit node,
   first rectifier means having first and second electrodes, one of which is an anode of the first rectifier means and the other of which is a cathode of the first rectifier means, said first electrode being coupled to the first circuit node and said second electrode being coupled to the collector of the transistor, the direction of conduction of the first rectifier means being the same as the direction of conduction through the collector-emitter path of the transistor,
   second rectifier means having an anode and a cathode connected in d.c. coupled relationship to the cathode and the anode respectively of the first rectifier means, and
   third rectifier means coupled between the first and second circuit nodes, the direction of conduction of the third rectifier means being opposite from that of the first rectifier means and the collector-emitter path of the transistor.

7. A power amplifier according to claim 6, wherein the transistor is an NPN transistor and the cathode of the first rectifier means is connected to the collector of the transistor.

8. A power amplifier circuit according to claim 6, wherein the first rectifier means comprise a first diode and the second rectifier means comprise at least a second diode having an anode in d.c. coupled relationship with the cathode of the first diode and a third diode having a cathode in d.c. coupled relationship with the anode of the first diode.

9. A power amplifier according to claim 6, comprising a decoupling inductor having a first terminal connected to the first circuit node and also having a second terminal, for connection to a d.c. voltage source.

* * * * *